United States Patent
Liem

(10) Patent No.: US 7,325,232 B2
(45) Date of Patent: Jan. 29, 2008

(54) COMPILER FOR MULTIPLE PROCESSOR AND DISTRIBUTED MEMORY ARCHITECTURES

(75) Inventor: Clifford Liem, Sunnyvale, CA (US)

(73) Assignee: Improv Systems, Inc., Beverly, MA (US)

( * ) Notice: Subject to any disclaimer, the term of this patent is extended or adjusted under 35 U.S.C. 154(b) by 721 days.

(21) Appl. No.: 10/057,728

(22) Filed: Jan. 25, 2002

(65) Prior Publication Data

US 2002/0124012 A1 Sep. 5, 2002

Related U.S. Application Data

(60) Provisional application No. 60/264,136, filed on Jan. 25, 2001.

(51) Int. Cl.
  *G06F 9/46* (2006.01)
  *G06F 15/173* (2006.01)
  *G06F 15/00* (2006.01)
  *G06F 9/44* (2006.01)
  *G06F 9/45* (2006.01)

(52) U.S. Cl. ............... 718/102; 718/103; 718/104; 709/223; 709/224; 709/225; 709/226; 712/24; 717/106; 717/140

(58) Field of Classification Search ........ 718/100–108; 713/100; 717/136–161, 106, 140; 716/1, 716/17; 703/2; 712/25, 24; 709/223–226
See application file for complete search history.

(56) References Cited

U.S. PATENT DOCUMENTS

| | | | |
|---|---|---|---|
| 5,021,947 A * | 6/1991 | Campbell et al. ............. | 712/25 |
| 5,179,702 A * | 1/1993 | Spix et al. ................... | 718/102 |
| 6,075,935 A * | 6/2000 | Ussery et al. ................ | 716/17 |
| 6,110,220 A | 8/2000 | Dave et al. .................... | 716/3 |
| 6,199,093 B1 * | 3/2001 | Yokoya ........................ | 718/102 |

(Continued)

FOREIGN PATENT DOCUMENTS

WO  WO 87/06034  * 10/1987

(Continued)

OTHER PUBLICATIONS

Levia, "Programming System Architectures with Java," *IEEE Computer Society*, vol. 32, No. 8, Aug. 1999, pp. 96-98, 101.

(Continued)

*Primary Examiner*—Meng-Al T. An
*Assistant Examiner*—Jennifer N. To
(74) *Attorney, Agent, or Firm*—Kurt Rauschenbach; Rauschenbach Patent Law Group, LLC

(57) ABSTRACT

A compiler for multiple processor and distributed memory architectures is described. The compiler uses a high-level language to represent a task-level network of behaviors that describes an embedded system. The compiler maps a plurality of tasks and data onto a multiple processor, distributed memory hardware architecture. The mapping includes describing a task-level network of behaviors, each of the task-level network of behaviors being related through control and data flow. The mapping further includes predicting a schedule of tasks for the task-level network of behaviors and allocating the plurality of tasks and data to at least one of the multiple processors and to at least one of distributed memory, respectively, in response to the predicted schedule of tasks.

22 Claims, 10 Drawing Sheets

U.S. PATENT DOCUMENTS

| | | | |
|---|---|---|---|
| 6,415,384 B1 * | 7/2002 | Dave | 713/100 |
| 6,973,417 B1 * | 12/2005 | Maxwell et al. | 703/2 |
| 2001/0003187 A1 * | 6/2001 | Aoki et al. | 709/102 |
| 2001/0025363 A1 * | 9/2001 | Ussery et al. | 716/1 |

FOREIGN PATENT DOCUMENTS

| WO | WO 99/28840 | 6/1999 | |
|---|---|---|---|
| WO | WO 00/60460 | 10/2000 | |
| WO | WO 00 60460 | * 10/2000 | |

OTHER PUBLICATIONS

Patent Cooperation Treaty, International Search Report, International Application No. PCT/US02/02085, mailed on Sep. 3, 2002, 7 pages.

* cited by examiner

CONTROL DATA-FLOW GRAPH

COMPILER FOR MULTIPLE PROCESSOR AND DISTRIBUTED MEMORY ARCHITECTURES

CROSS-REFERENCE TO RELATED CASES

This claims priority to and the benefit of Provisional U.S. Patent Application Ser. No. 60/264,136 filed Jan. 25, 2001, the entirety of which is hereby incorporated by reference.

FIELD OF THE INVENTION

The invention relates to compilers and methods of compiling high-level languages. In particular, the invention relates to methods and apparatus for mapping a high-level language description of an embedded system into a hardware architecture of a custom integrated circuit.

BACKGROUND OF THE INVENTION

Custom integrated circuits are widely used in modern electronic equipment. The demand for custom integrated circuits is rapidly increasing because of the dramatic growth in the demand for highly specific consumer electronics and a trend towards increased product functionality. Also, the use of custom integrated circuits is advantageous because custom circuits reduce system complexity and, therefore, lower manufacturing costs, increase reliability and increase system performance.

There are numerous types of custom integrated circuits. One type consists of programmable logic devices (PLDs), including field programmable gate arrays (FPGAs). FPGAs are designed to be programmed by the end designer using special-purpose equipment. PLDs are, however, undesirable for many applications because they operate at relatively slow speeds, have a relatively low integration, and have relatively high cost per chip.

Another type of custom integrated circuit is an application-specific integrated circuit (ASIC). Gate-array based and cell-based ASICs are often referred to as "semi-custom" ASICs. Semi-custom ASICs are programmed by either defining the placement and interconnection of a collection of predefined logic cells which are used to create a mask for manufacturing the integrated circuit (cell-based) or defining the final metal interconnection layers to lay over a predefined pattern of transistors on the silicon (gate-array-based). Semi-custom ASICs can achieve high performance and high integration but can be undesirable because they have relatively high design costs, have relatively long design cycles (the time it takes to transform a defined functionality into a mask), and relatively low predictability of integrating into an overall electronic system.

Another type of custom integrated circuit is referred to as application-specific standard parts (ASSPs), which are non-programmable integrated circuits that are designed for specific applications. These devices are typically purchased off-the-shelf from integrated circuit suppliers. ASSPs have predetermined architectures and input and output interfaces. They are typically designed for specific products and, therefore, have short product lifetimes.

Yet another type of custom integrated circuit is referred to as a software-only architecture. This type of custom integrated circuit uses a general-purpose processor and a high-level language compiler. The designer programs the desired functions with a high-level language. The compiler generates the machine code that instructs the processor to perform the desired functions. Software-only designs typically use general-purpose hardware to perform the desired functions and, therefore, have relatively poor performance because the hardware is not optimized to perform the desired functions.

A relatively new type of custom integrated circuit uses a configurable processor architecture. Configurable processor architectures allow a designer to rapidly add custom logic to a circuit. Configurable processor circuits have relatively high performance and provide rapid time-to-market. There are two major types of configurable processors circuits. One type of configurable processor circuit uses configurable Reduced Instruction-Set Computing (RISC) processor architectures. The other type of configurable processors circuit uses configurable Very Long Instruction Word (VLIW) processor architectures.

RISC processor architectures reduce the width of the instruction words to increase performance. Configurable RISC processor architectures provide the ability to introduce custom instructions into a RISC processor in order to accelerate common operations. Some configurable RISC processor circuits include custom logic for these operations that is added into the sequential data path of the processor. Configurable RISC processor circuits have a modest incremental improvement in performance relative to non-configurable RISC processors circuits.

The improved performance of configurable RISC processor circuits relative to ASIC circuits is achieved by converting operations that take multiple RISC instructions to execute and reducing them to a single operation. However, the incremental performance improvements achieved with configurable RISC processor circuits are far less than that of custom circuits that use custom logic blocks to produce parallel data flow.

VLIW processor architectures increase the width of the instruction words to increase performance. Configurable VLIW processor architectures provide the ability to use parallel execution of operations. Configurable VLIW processor architectures are used in some state-of-the art Digital Signal Processing (DSP) circuits. These known configurable VLIW processor architectures are single processor architectures and typically require a relatively large amount of memory. The ability to add custom logic units in such configurable VLIW processor architectures is limited to adding custom logic units in predefined locations in the data path.

Known configurable VLIW processor architectures are difficult to support with high-level language compilers and difficult to design with known compilers. These compilers are relatively complex. Configurability is typically achieved by custom assembly language programming. Using assembly language programming is more difficult and time consuming and, therefore increases the time-to-market and the cost of goods using such processors.

SUMMARY OF THE INVENTION

A compiler for multiple processor and distributed memory architectures according to the present invention uses a high-level language to represent the task-level network of behaviors that describes an embedded system. Using a high-level programming language allows the designer to code an intuitive network of tasks that are related through control and data flow connections. The compiler can directly map a task-level network of behaviors onto a multiple processor and distributed memory hardware architecture.

A compiler and method of compiling according to the present invention is independent of the number of processors and independent of the number of shared and private data memory resources. A compiler according to the present invention can be highly automated and can efficiently automate mapping tasks onto binary code that can be executed on a physical architecture.

Thus, in one aspect, the invention is embodied in a method of mapping a plurality of tasks and data onto a multiple processor, distributed memory hardware architecture. The method includes describing a task-level network of behaviors. Each of the task-level network of behaviors is related through control and data flow.

The method also includes predicting a schedule of tasks for the task-level network of behaviors. In one embodiment, the predicting includes minimizing an execution time for the plurality of tasks. In one embodiment, the predicting includes minimizing the schedule of tasks by allocating data to the distributed memories in order to minimize data transfers. In one embodiment, the predicting includes maximizing parallel execution of the plurality of tasks on at least two processors of the multiple processors. In one embodiment, the predicting the schedule of tasks includes using a resource-based model of the hardware architecture to predict the schedule of tasks. In yet another embodiment, the predicting includes using an interval graph and an execution time model of the task-level network of behaviors to predict the schedule of tasks.

The method further includes allocating the plurality of tasks and data to at least one of the multiple processors and to at least one of distributed memory, respectively, in response to the predicted schedule of tasks. In one embodiment, the allocation includes allocating tasks to one of the multiple processors that has optimal processor resources for the tasks. In one embodiment, the allocation of the plurality of tasks and data includes an iterative allocation process that uses a demand-driven and constraint-based objective function to determine the allocation. In one embodiment, the allocation of the plurality of data to the distributed memories includes allocating data to shared memories. In another embodiment, the allocation of the plurality of data to the distributed memories includes allocating data to private memories.

In one embodiment, the description of the task-level network of behaviors includes describing a task-level network of behaviors in a high-level programming language. In one embodiment, the description of the task-level network of behaviors in the high-level programming language includes parsing the high-level programming language into an intermediate form. In one embodiment, the method includes generating machine executable code for the multiple processor, distributed memory hardware architecture based at least in part on allocating the plurality of tasks and data.

In another aspect, the invention is embodied in a method for generating a control graph for a compiler used to map a plurality of tasks and data onto a multiple processor, distributed memory hardware architecture. The method includes parsing a plurality of tasks into an internal compiler form of interconnected task nodes. A compiler representation is then linked to each interconnected task node using directed edges for the purpose of substantially simultaneously mapping the tasks to multiple processors in the multiple processor, distributed memory hardware architecture.

In one embodiment, the method further includes binding the interconnected task nodes to the directed edges. In one embodiment, the method includes parsing a plurality of data blocks into an internal compiler form of data nodes and linking a compiler representation to each data node using directed edges. The directed edges can represent time intervals. The time intervals can include the period between tasks, the time period from beginning a task to ending a task, or a set time period. In one embodiment, the time interval includes a time period between time periods.

In another aspect, the invention is embodied in a method for executing a schedule of tasks in a multiple processor, distributed memory architecture. The method includes generating the schedule of tasks based at least in part on a task-level network of behaviors.

A demand function is calculated based at least in part on a constraint related to at least one of a plurality of tasks in the schedule of tasks. In one embodiment, the demand function can be calculated based at least in part on the task-level network of behaviors. In one embodiment, the demand function is calculated based at least in part on an impact on the schedule of tasks. In one embodiment, the demand function is calculated based at least in part on an impact on data movement. In one embodiment, the demand function is calculated based at least in part on prior allocation decisions.

The method further includes allocating a task having highest priority to a processor having the least cost according to the demand function. In one embodiment, the cost is defined as the least negative impact on at least one performance factor. The performance factor can include the schedule of tasks or data movement.

In one embodiment, the method includes allocating a data block to a memory in the distributed memory. In still one embodiment, the method includes allocating a task having next highest priority to a processor having next least cost according to the demand function. In yet another embodiment, the method further includes recalculating the demand function in response to each task in the plurality of tasks being allocated to a processor.

BRIEF DESCRIPTION OF THE DRAWINGS

The above and further advantages of this invention may be better understood by referring to the following description in conjunction with the accompanying drawings, in which like numerals indicate like structural elements and features in various figures. The drawings are not necessarily to scale, emphasis instead being placed upon illustrating the principles of the invention.

DETAILED DESCRIPTION

A compiler according to the present invention can be used to map a high-level language program that represents a task-level network of behaviors that describes an embedded system onto a multiple processor and distributed memory hardware architecture. Such an architecture is described in co-pending U.S. patent application Ser. No. 09/480,087 entitled "Designer Configurable Multi-Processor System," filed on Jan. 10, 2000, which is assigned to the present assignee. The entire disclosure of U.S. patent application Ser. No. 09/480,087 is incorporated herein by reference.

Figure 1:
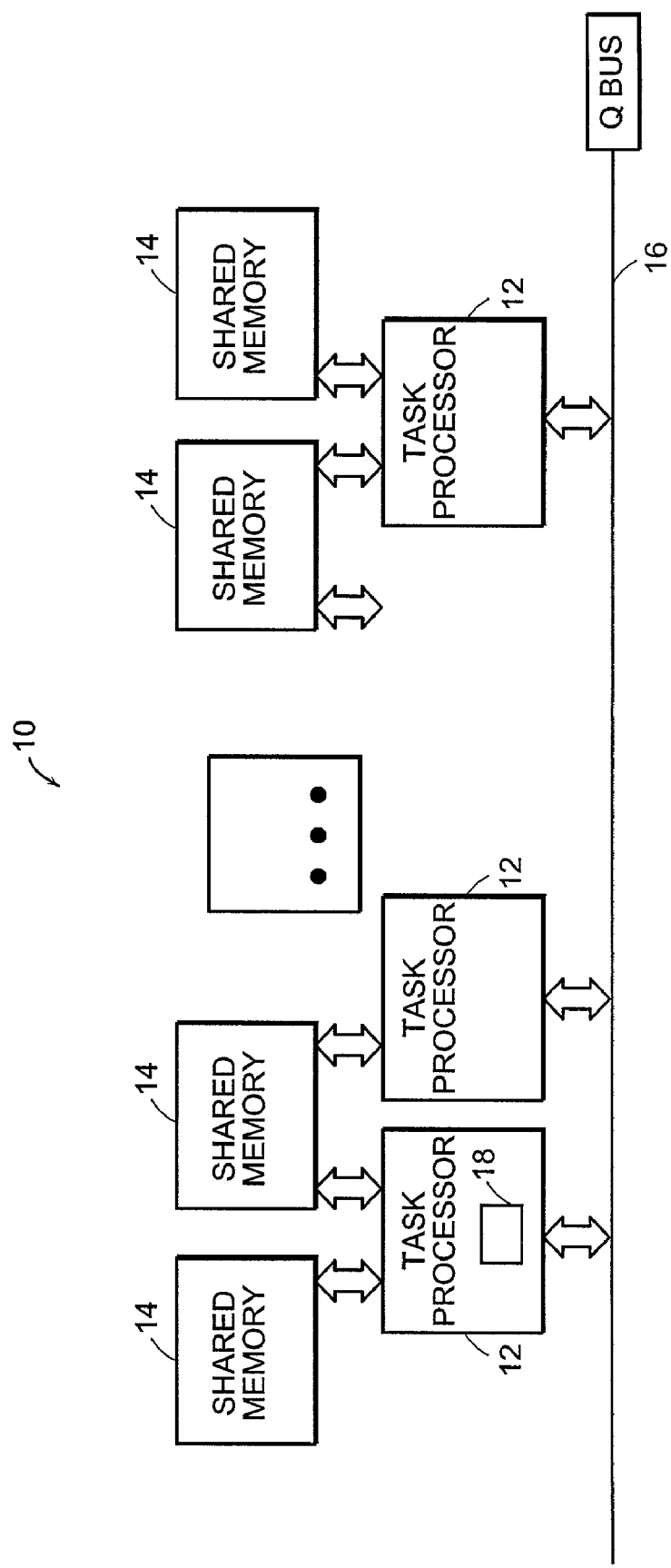
FIG. 1 illustrates a schematic block diagram of a multi-processor hardware architecture that includes a plurality of task processors that are in communication with a plurality of distributed shared memories, where each of the plurality of shared memory connects to a maximum of two task processors according to the present invention.

Referring more particularly to the figures, FIG. 1 illustrates a schematic block diagram of a multi-processor architecture 10 that includes a plurality of task engines or task processors 12 that are in communication with a plurality of distributed shared memories 14. The task processors 12 are connected in a linear architecture. Each shared memory 14 connects to at most two of the plurality of task processors 12.

The plurality of task processors 12 is in communication with a task queue bus (Q-Bus) 16. The Q-bus 16 is a global bus for communicating on-chip task and control information between the plurality of processor task processors 12. Each task processor 12 includes a task queue 18 that communicates with the task queue bus 16. The task queue 18 includes a stack, such as a FIFO stack, that stores tasks to be executed by the task processor 12. The plurality of distributed shared memories 14 are in communication with the plurality of task processors 12. Each of the plurality of distributed shared memories 14 is connected to a maximum of two of the plurality of task processors 12.

Figure 2:
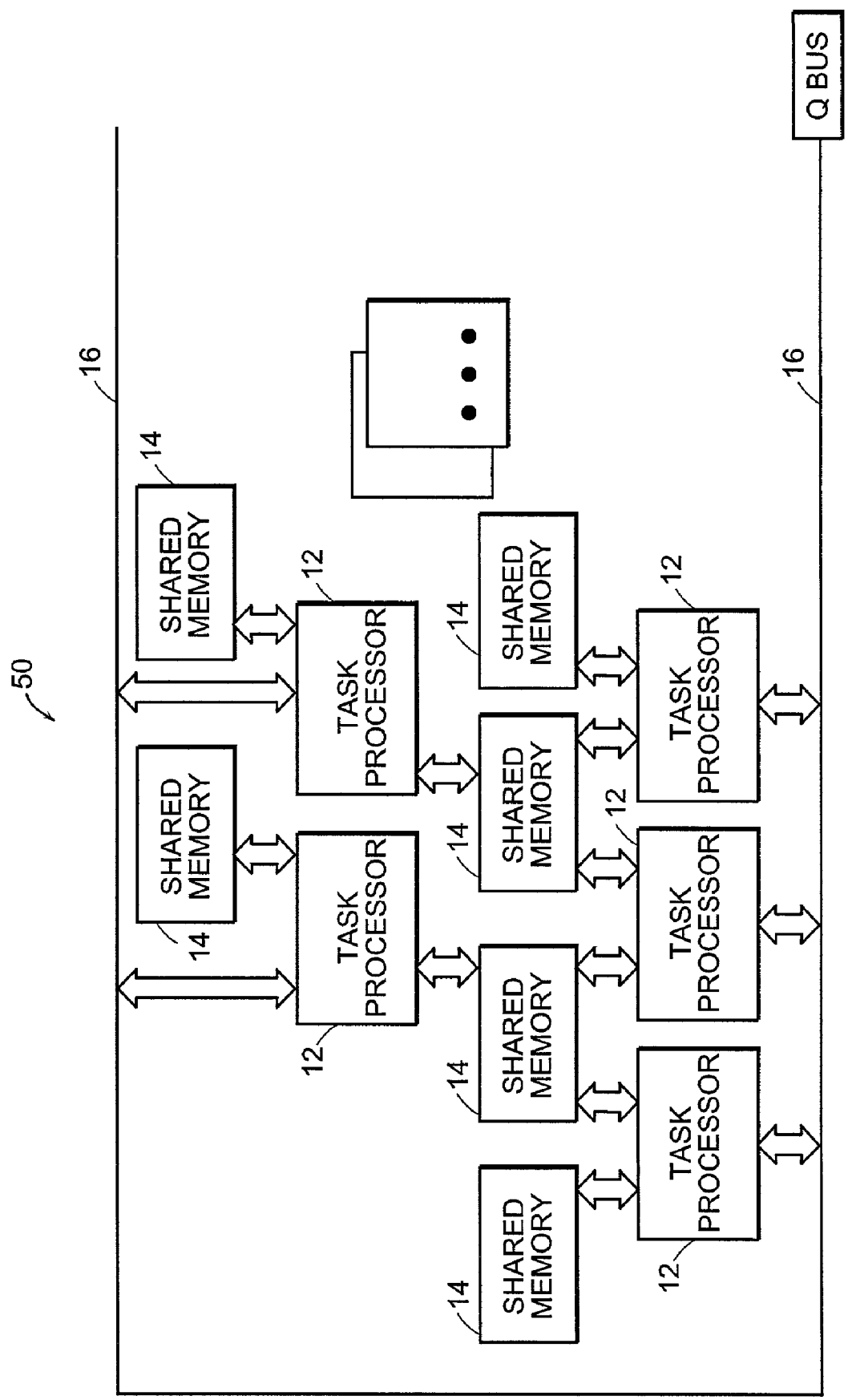
FIG. 2 illustrates a schematic block diagram of a multi-processor hardware architecture that includes a plurality of task processors that are in communication with a plurality of distributed shared memories, where each of the plurality of shared memory connects to a maximum of three task processors according to the present invention.

FIG. 2 illustrates a schematic block diagram of a multi-processor hardware architecture 50 that includes a plurality of task processors 12 that are in communication with a plurality of distributed shared memories 14. Each of the plurality of distributed shared memories 14 connects to a maximum of three of the plurality of task processors 12 according to the present invention.

The architecture 50 of FIG. 2 is similar to the architecture 10 of FIG. 1. Each of the plurality of processors 12 is connected in a linear architecture. The plurality of task processors 12 are in communication with a task queue bus (Q-Bus) 16, which is a global bus for communicating on-chip task and control information between the each of the plurality of task processors 12.

The plurality of distributed shared memories 14 are in communication with the plurality of task processors 12. Each of the plurality of distributed shared memories 14 is connected to a maximum of three of the plurality of task processors 12. The architecture 50 of FIG. 2 has some advantages in comparison to the architecture 10 of FIG. 1. The greater number of processor connections to each of the plurality of shared memories 14 increases the number of possible multi-processor architecture topologies and, therefore, the flexibility of the architecture. Increasing the number of processor connections to shared memories 14, however, may lower the maximum obtainable clock rate of the architecture.

Figure 3:
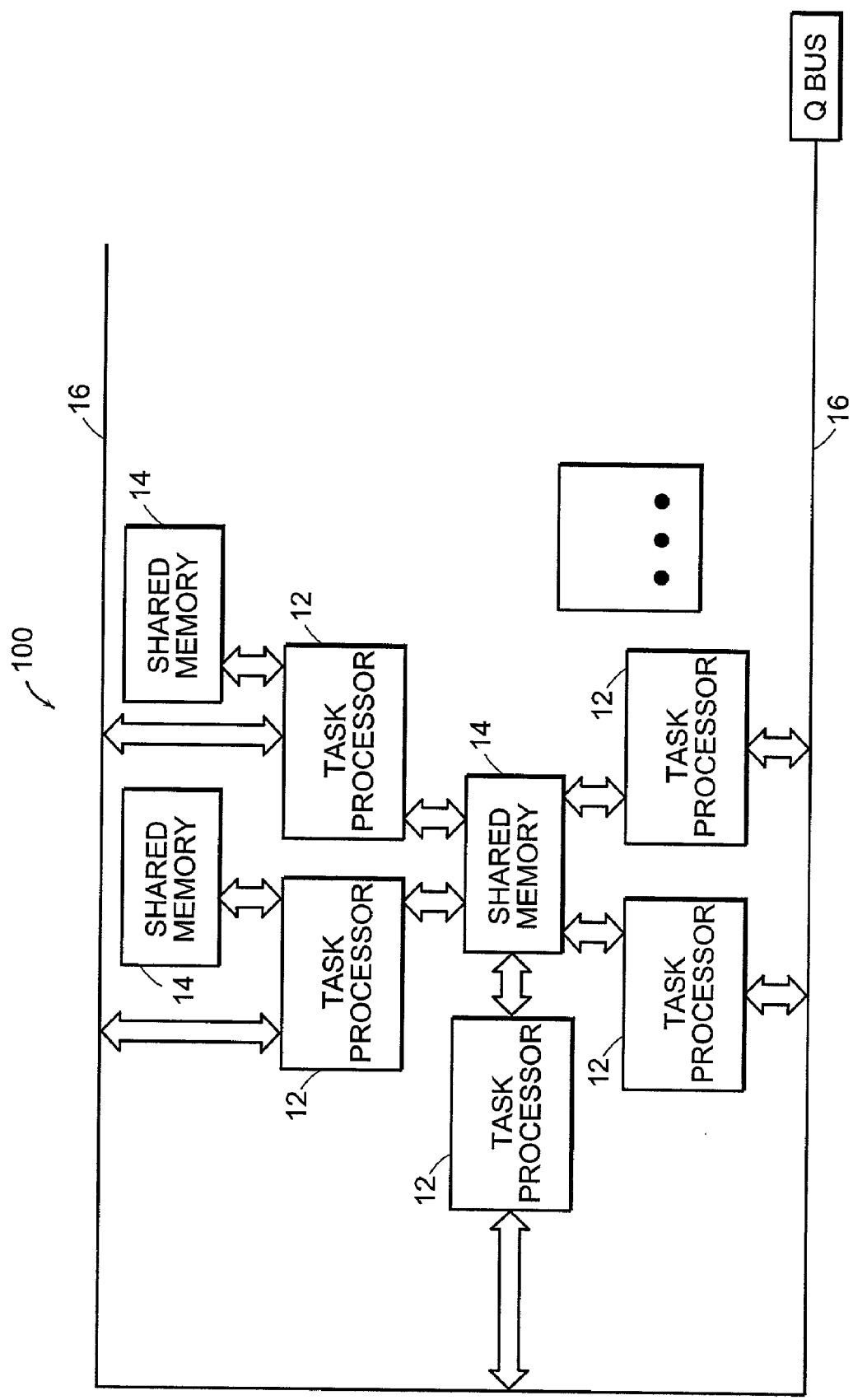
FIG. 3 illustrates a schematic block diagram of a multi-processor hardware architecture that includes a plurality of task processors that are in communication with a plurality of distributed shared memories, where each of the plurality of shared memory connects to N task processors according to the present invention.

FIG. 3 illustrates a schematic block diagram of a multi-processor hardware architecture 100 that includes a plurality of task processors 12 that are in communication with a plurality of distributed shared memories 14. Each of the plurality of distributed shared memory 14 connects to N task processors 12 according to the present invention. The architecture 100 is a generalized multi-processor architecture, where any number of task processors 12 can be connected to one global distributed shared memory 14.

The architecture 100 of FIG. 3 is similar to the architectures 10 of FIG. 1 and 50 of FIG. 2. Each of the plurality of task processors 12 is connected in a linear architecture. The plurality of task processors 12 are in communication with a task queue bus (Q-Bus) 16. The plurality of distributed shared memories 14 are in communication with the plurality of task processors 12. Each of the plurality of shared memories is connected to N task processors 12. This architecture 100 has numerous flexible multiprocessor architecture topologies because of the unlimited number of processor connections to each of the plurality of shared memories 14.

A compiler that implements a method according to the present invention generates object code for the multi-processor architectures 10, 50, and 100 of FIGS. 1 though 3, respectively. The compiler generates code for multi-processor architectures 10, 50, and 100 having any number of task processors 12 and any number of distributed shared memories 14 that are in communication the task processors 12.

Figure 4:
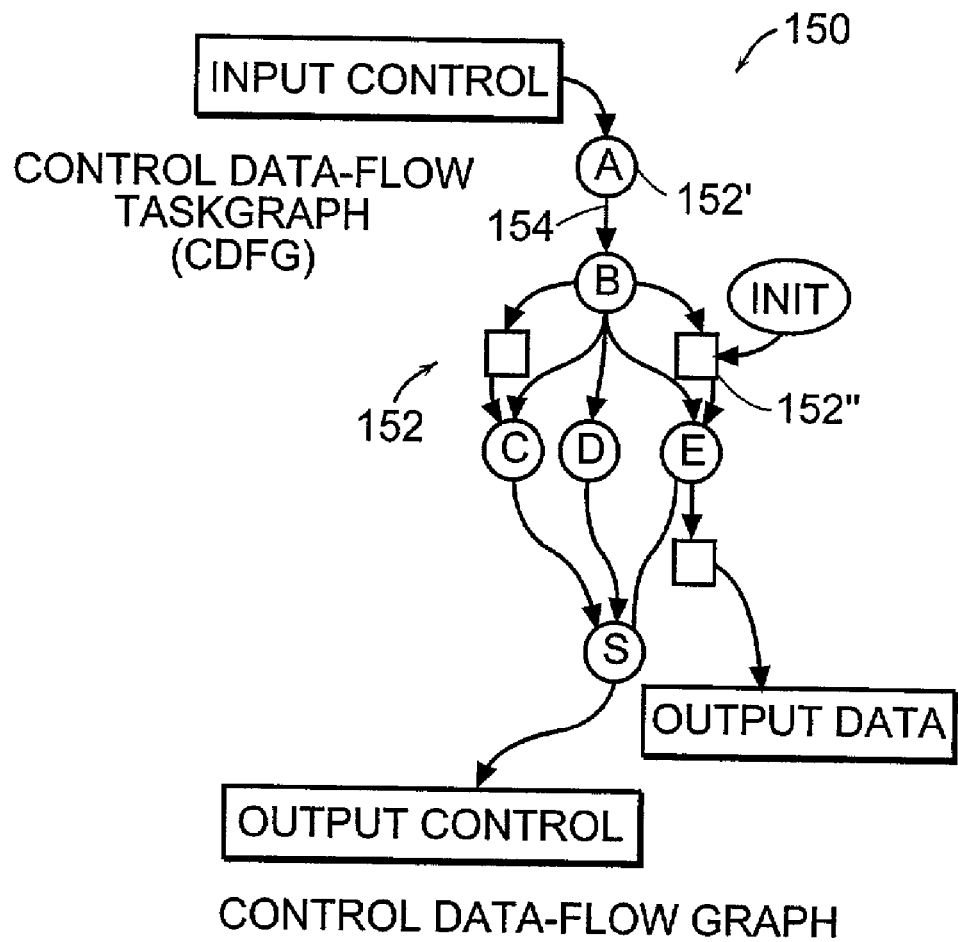
FIG. 4 illustrates a control data-flow task graph according to a method of compiling according to the present invention.

FIG. 4 illustrates a control data-flow task graph 150 according to the present invention. By control data-flow graph we mean a graph that represents the flow of a program including the interrelated task and data dependencies. The control data-flow graph 150 is also referred to as an intermediate compiler representation. The control data-flow graph 150 uses a hardware architectural model as the target. The target is a representation of the task processors 12 (FIG. 3) being targeted. For example, the architectural model contains resource information corresponding to each task processor 12 in the plurality of task processors. The resource information can include information about computational units, size of memories, width of registers, etc. The tasks are parsed into an internal compiler form of nodes 152. Internal compiler forms of nodes 152 are schematic representations of program parts or program sections. Some nodes are task nodes 152' that represent tasks. Other nodes are data nodes 152" that represent data blocks.

The task nodes 152' are interconnected with directed edges 154 that represent a specific order of events. Directed edges represent a connection between two nodes of a directed graph. By graph we mean a set of nodes and a relationship between the nodes. In a directed graph, an edge goes from one node to another and hence makes a connection in only one direction. A directed graph is a graph whose edges are ordered pairs of nodes. That is, each edge can be followed from one node to the next node. In one embodiment, the method uses a directed acyclic graph. Directed acyclic graphs are directed graphs where the paths do not start and end at the same node.

A compiler representation is linked or associated with to each task node 152'. The compiler representations are abstract syntax trees representing executable behaviors that are specified in procedural programming semantics code. The compiler associates the code with available program memory within the hardware architecture. A set of variable symbols is linked to each data node 152". The variable symbols are static variables in the program. In one embodiment, the variable symbols can be an array, for example. The variable symbols are specified as data records in the programming language. In one embodiment, the programming language is an object oriented programming language, such as JAVA, for example.

In one embodiment, an execution schedule of tasks is predicted. The execution schedule is predicted using a time model. For example, a prediction of the amount of time to execute each task can be used in the time model. In addition, a prediction of the order in which each task should execute can also be used in the time model. In one embodiment, the compiler minimizes the predicted execution schedule of tasks in the task graph 150. The compiler can minimize the predicted execution schedule in numerous ways. For example, the compiler can minimize the predicted execution schedule by allocating tasks to the processors in order to achieve maximum parallelism. By parallelism we mean executing more than one task in parallel.

Figure 5:
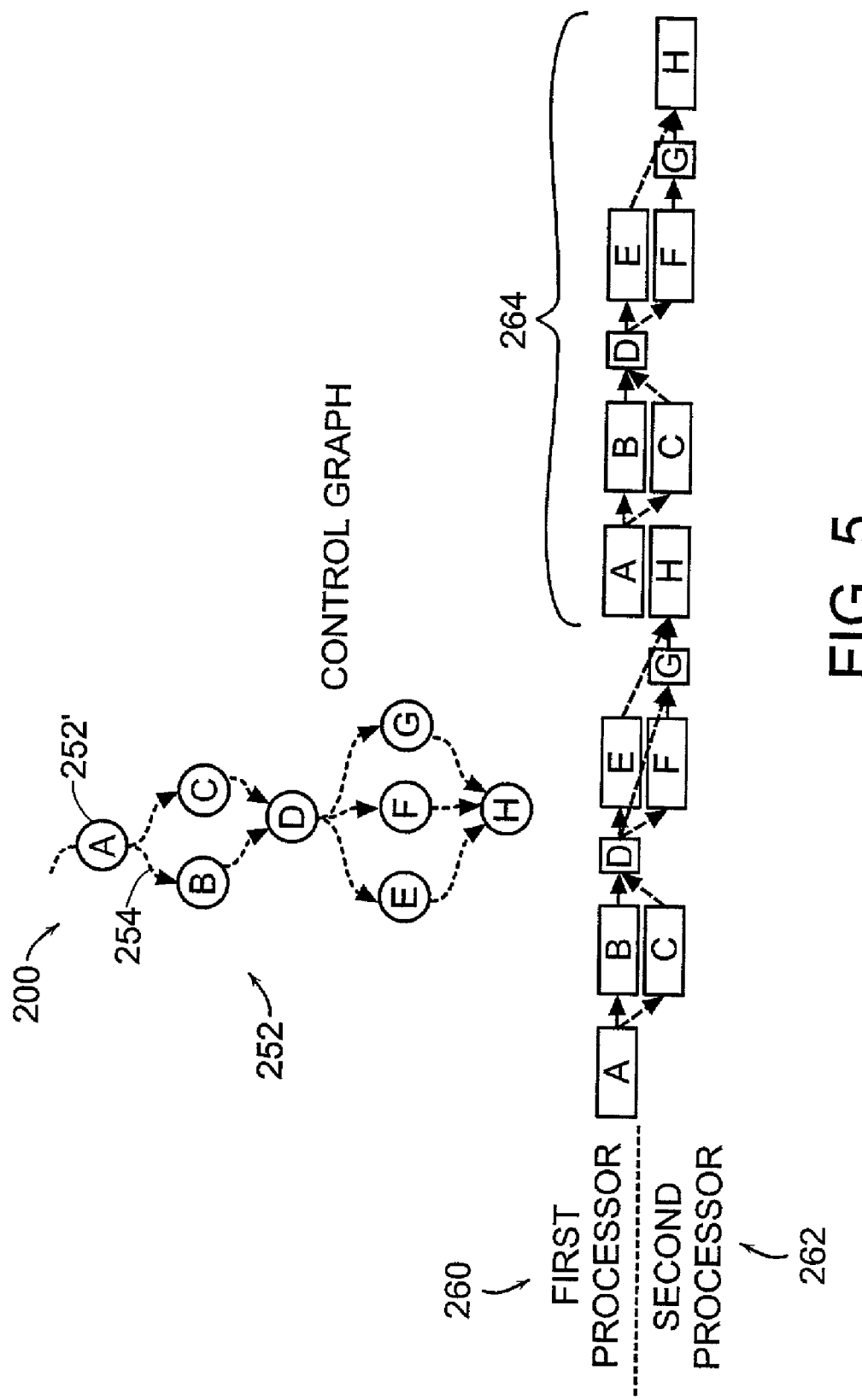
FIG. 5 illustrates a control data flow task graph describing an example of the execution of a schedule of tasks according to the invention.

FIG. 5 illustrates a control data flow task graph describing an example of the execution of a schedule of tasks according to the invention. The tasks are parsed into an internal compiler form of nodes 252. The control graph 200 includes the task nodes 252'. The task nodes 252' are related through the directed edges 254. Tasks are assigned to a first 260 and a second processor 262. The first 260 and second processor 262 are represented by rows of tasks. In this example, the task A and task B are assigned to the first processor 260. Task C is then assigned to the second processor 262. Task D, which is associated with task B and task C is assigned to the first processor 260. In addition, task E is assigned to the first processor 260 and task F is assigned to the second processor 262. Task G is then assigned to the second processor 262. Task H is then assigned to the second processor 226. In this example, the control graph 200 then iterated a second time 264.

In one embodiment, the compiler can minimize the predicted execution schedule by allocating tasks to processors that allow optimal use of execution resources on the processor. In addition, the compiler can minimize the predicted execution schedule by allocating data to specific memories that minimize data transfers. In another embodiment, the compiler minimizes the predicted execution schedule by choosing the processor that has the appropriate computational units. For example, a task can execute more efficiently on a processor having optimized computational units. Thus, if a task requires many multiplying operations, the compiler can assign a processor that contains an adequate number of multipliers to handle the task.

In one embodiment, the compiler determines an estimate of the run time by counting the number of predicted instructions that are expected in the task body or program section. The task body is the behavioral code that corresponds to a specific task. The compiler can also determine an estimate of minimum, maximum, or average expected run-time. For example, in a program snippet containing an "IF, ELSE" statement, if the body of the "IF" statement is relatively long and the body of the "ELSE" statement is relatively short, the compiler can estimate that the run-time of the "IF" statement is longer than the run-time of the "ELSE" statement. Based on these estimates, the compiler can compute an average run-time for this program snippet.

Figure 6:
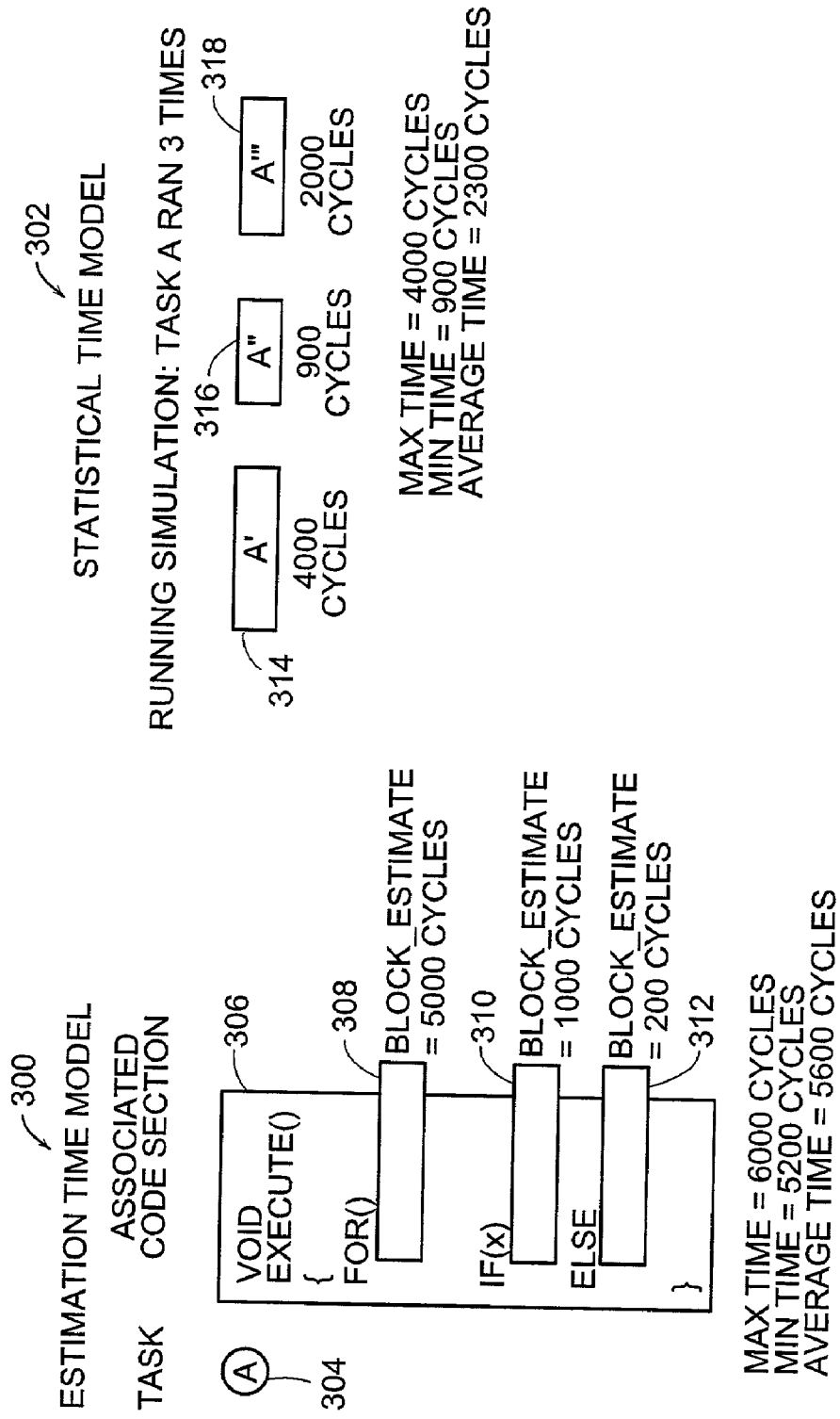
FIG. 6. illustrates an example of an estimated time model and a statistical time model according to the invention.

FIG. 6. illustrates an example of an estimated time model 300 and a statistical time model 302 according to the invention. The time models 300, 302 are representative of the task A 304. The task A 304 includes an associated code section 306. In one embodiment, the associated code section 306 includes individual program blocks 308, 310, and 312. The program blocks 308, 310, and 312 have an estimated run-time associated with them. For example, the estimated run-time for the program block 308 may be 5000 cycles, the estimated run-time for the program block 310 may be 1000 cycles, and the estimated run-time for the program block 312 may be 200 cycles. In this example, the maximum number of estimated cycles the code section 306 takes to execute is 6000 cycles and the minimum number of estimated cycles the code section 306 takes to execute is 5200 cycles. Hence, the average number of estimated cycles the code section 306 takes to execute is 5600 cycles.

In another embodiment, the method can measure run-time determined by a profiling simulation of the system in a typical execution scenario. In yet another embodiment, the profiling simulation is a second-time-around compilation. By second-time-around compilation, we mean the compiler compiles and then executes the program, thereby generating simulator run-times. In one embodiment, the profiling simulation generates information such as how long each program section takes to execute and how often each program section is executed. The profiling generates statistics that are used in a time-based model of the program. The profiling statistics are used in the subsequent compilations. In another embodiment, further measured run-time statistics can be retained and used as another more accurate time based model.

Referring to FIG. 6, the statistical time model 302 illustrates three simulated run-times of the task A 304. In the first running simulation 314, the task A 304 takes 4000 cycles to execute. In the second running simulation 316, the task A 304 takes 900 cycles to execute. In the third running simulation 318, the task A 304 takes 2000 cycles to execute. Hence, the average statistical run-time for task A is 2300 cycles.

In one embodiment, the compiler performs constraint-oriented and demand-driven scheduling. By constraint-oriented, we mean the program can include constraints that are required by the program prior to compilation. For example, a user may require that a specific piece of data be available to a specific memory at a specific address. The compiler is said to be constrained by this information, because the user specified this requirement in the program. In alternate embodiments, the scheduling determined during compilation respects constraints of tasks requiring specific hardware resources, such as special purpose processors. The scheduling determined during compilation also respects user constraints on the placement of data and/or tasks.

Demand-driven refers to the objective that the allocation algorithm utilizes for the scheduling. As each node is allocated, a demand is placed on each subsequently allocated node because the cost associated with each subsequent node increases. Thus, the cost associated with each node is encapsulated in a demand function.

Figure 7:
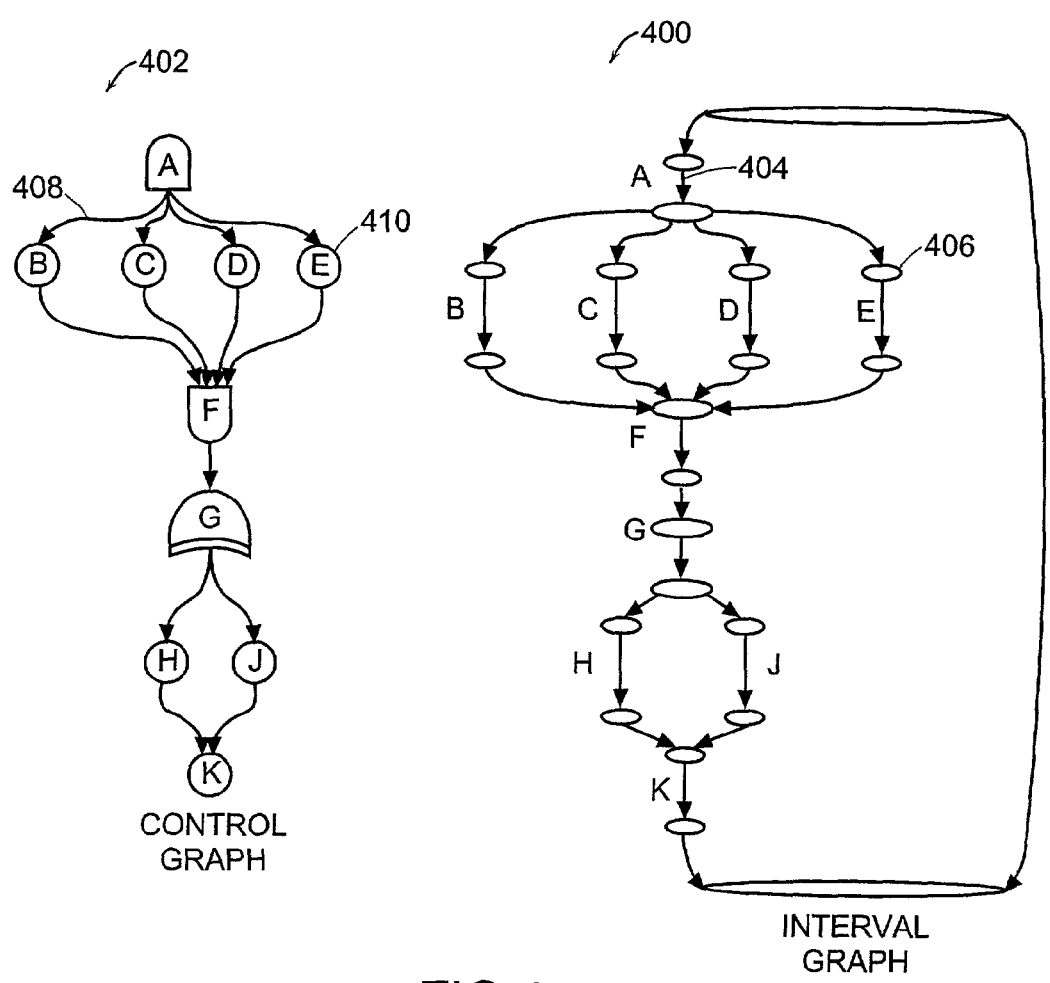
FIG. 7 illustrates an interval graph according to the method of the present invention.

FIG. 7 illustrates an interval graph 400 according to the method of the present invention. The interval graph 400 is represented in a time domain and corresponds to the control graph 402. In the interval graph 400, edges 404 indicate time intervals and nodes 406 indicate points in time. The edges 404 can represent any time interval. That is, the edges 404 can represent a time interval between tasks or a time interval from the beginning of a task to the end of a task. The edges 404 can have a specific length of time associated with them. The edges 404 can also represent a maximum amount of time. In addition, the edges 404 can represent a time order between two nodes 406 (i.e., between two time points).

In one embodiment, a method according to the present invention begins by generating a maximum interval graph. The maximum interval graph is generated based on the resources available in the target configuration. For example, if four processors are available, the method starts with four edges that represent intervals. Any constraints are then applied to the graph. This causes the graph to change dynamically because the constraints require that some points in time cannot change. Thus, when a new moment in time is represented, a new edge must be added to the interval graph.

A compiler according to the present invention generates the interval graph 400 from the control graph 402. Time intervals 404 in the interval graph 400 represent directed edges 408 in the control graph 402. Time points 406 in the interval graph 400 represent nodes 410 in the control graph 402. The interval graph 400 represents maximally parallel execution of tasks, assuming an infinite number of resources. By infinite number of resources we mean that desired resources are always available.

Numerous time models for the compiler may be used to represent the run-time of each time interval 404 or time point 406 in the interval graph 400. For example, one time model determines the run time by counting the number of predicted instructions that are expected in the task body. This estimate can include characterizations such as minimum, maximum, or average expected run-time. Another time model of the compiler determines the run time by a profiling simulation of the system in a typical execution scenario. The simulated run-time statistics can be retained and used as the time model.

A compiler implementing the method binds the nodes 410 in the control graph 402 to the edges 408 or time intervals 404 in the interval graph 400 by an allocation step. Allocation can be performed in numerous ways. In one embodiment, the compiler performs allocation by first analyzing constraints of the control graph 402 and then embedding the constraint to a node 410 on the control graph 402. A maximally parallel interval graph 400 is then constructed, assuming infinite resources.

A demand function is then calculated based on numerous factors that may include graph constraints, impact on the schedule, impact on the data movement, effect of previous allocation decisions, the estimated run-time of a task, and the estimated computing resources needed by a task. Skilled artisans will appreciate that many other factors can also be used. The demand function is a weighted sum of these factors. The weights represent the importance of each factor. The effect of previous allocation decisions may include control neighbor assignment and data neighbor assignment. For example, the demand function may be a weighted sum of constraints (C), schedule (S), data movement (D), control neighbor assigned (CN), data neighbor assigned (DN), the estimated run-time of a task (RT), and the estimated computing resources needed by a task (CR). In this example, the objective (O) is equal to the following demand function:

$$O=C*W1+S*W2+D*W3+CN*W4+DN*W5+RT*W6+CR*W7$$

The weights, W1 through W7, are reflective of the "importance" of each factor. Their exact values can be determined empirically by experimentation. In one embodiment, each weight is an order of magnitude different from the other weights. In one example, the weights are as follows: W1=1000000.00, W2=100000.00, W3=10.0, W4=1.0, W5=100.0, W6=0.1, and W7=0.01. Each node can be evaluated at a specific time using the demand function. At each point in the allocation, the demand function can be calculated for the node. At each decision in the allocation, the demand functions are re-computed for each node. The next node to be allocated is based on the re-calculated demand functions. In one embodiment, the next node is the node having the most demand at a certain point in time. After the next allocation is made, the demand function is re-computed for the remaining nodes. The node with the next highest demand is allocated next. This iteration continues until all of the nodes are allocated.

The task with the highest demand is allocated to a processor with the least cost. By cost, we mean the least negative impact on performance factors, such as schedule and data movement. One metric for cost is a weighted sum of the impact on the schedule and the impact on data movement. After the task is allocated, the interval graph 400 is updated with the appropriate dependencies, such as precedence edges indicating that a task will execute prior to another. The precedence edges do not represent time intervals, but instead represent a precedence or an order.

The compiler allocates any data connected to the task to shared or private memories. In one embodiment, the compiler allocates data in a progressive manner. In this embodiment, the compiler allocates a control node and then the data associated with the control node is allocated. For example, if a task node is bound to a specific processor, the data associated with that task node must be allocated to one of the data memories associated with that specific processor. The compiler then progressively makes the decision as to which data memory to use. The decision depends on other decisions, and the decisions narrow as more decisions are made. A data element is allocated to as many resources as possible until other allocation decisions refine the number of resources to which it can be allocated.

In another embodiment, the allocation algorithm progressively allocates data based on the allocation of tasks. Once a task is allocated to a processor, its connected data is 'softly' allocated to all the data memories connected to the processor. As other tasks are allocated, the choices for the allocation of the data become 'firmer'. Once all the tasks are allocated, a 'hard' choice is made for the allocation of the data to a specific memory.

The method is repeated until all the tasks have been assigned to processors and data has been assigned to shared and private memories. A new demand function is calculated based the above factors. A new order of allocation is then determined from the new demand function. The remaining tasks with the highest demand are allocated to the processor with the least cost, as described above. After the new tasks are allocated, the interval graph 400 is updated with the appropriate dependencies, such as precedence edges indicating task priority. Any data connected to the task is then allocated to shared or private memories. The data elements are allocated to as many resources as possible until they are 'firmly' allocated to specific resources as described above.

Figure 8:
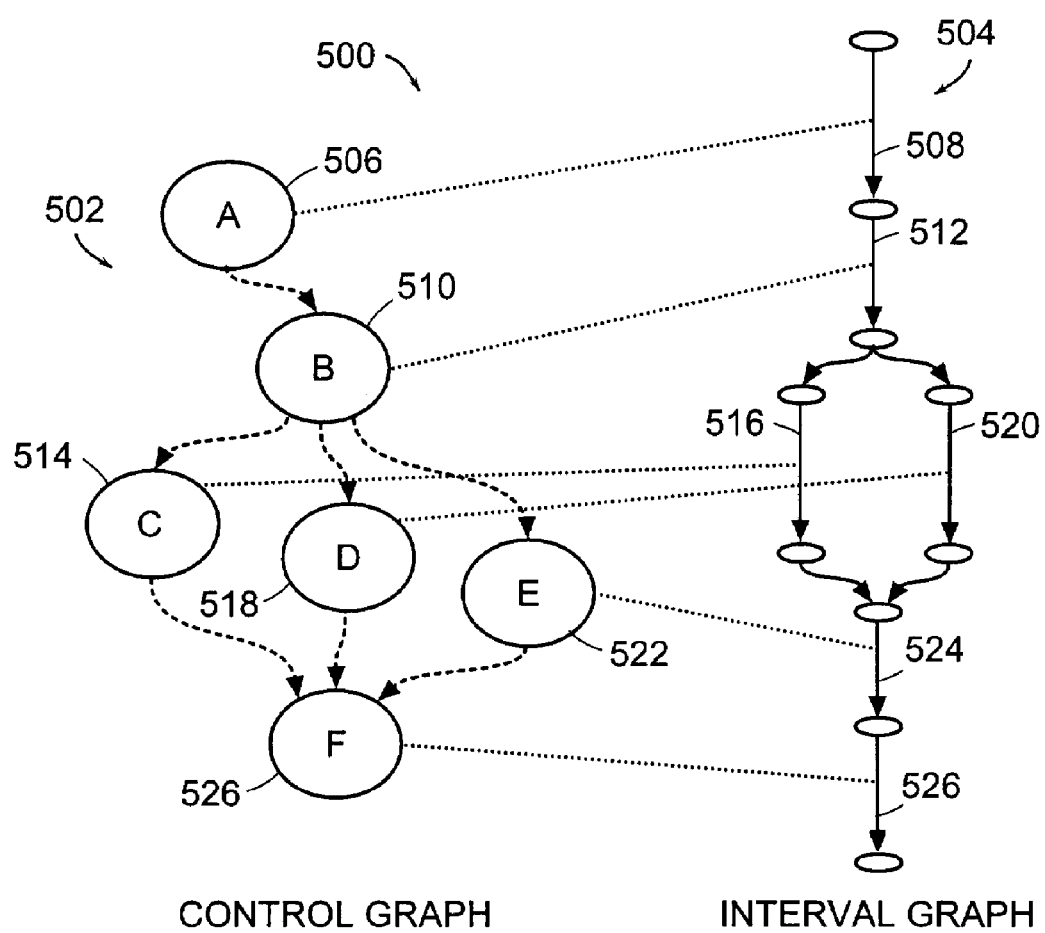
FIG. 8 illustrates an example of a schedule for determining an order for which tasks execute according to the invention.

FIG. 8 illustrates an example of a schedule 500 for determining an order for which tasks execute according to the invention. In one embodiment, the tasks in the control graph 502 are associated with intervals in the interval graph 504. For example, the task A 506 is associated with the interval 508. The task B 510 is associated with the interval 512. The task C 514 is associated with the interval 516. The task D 518 is associated with the interval 520. The task E 522 is associated with the interval 524. The task F 526 is associated with the interval 526.

In one embodiment, the allocation of task node in the schedule proceeds as follows. During allocation, the method of the invention binds a task node 506 from the control graph 502 to the interval 508 in the interval graph 504. Thus, the task node 506 is expected to execute at the interval 508. Each node in the control graph 502 is bound by the edges in the interval graph 504. The binding process associates a task node to an interval. As task nodes are bound to intervals in the interval graph 504, the interval graph 504 dynamically changes. In another embodiment, additional intervals can be added to the interval graph 504, further changing the interval graph 504. Once the interval graph 504 is completely bound to the control graph 502, a full schedule is created.

Figure 9:
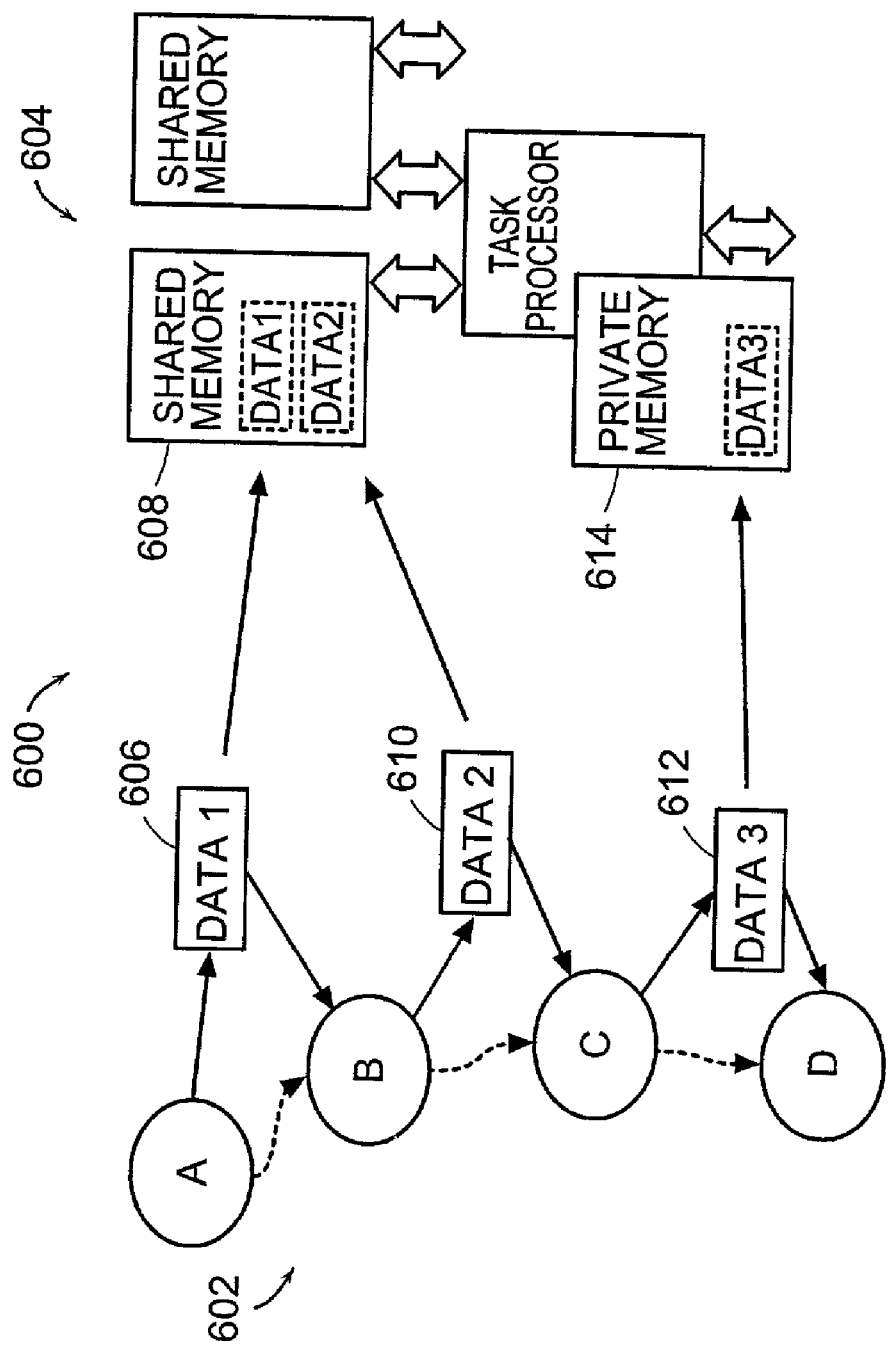
FIG. 9 is a flowchart illustrating the association of data records with available data memory within the multiprocessor architecture according to the invention.

FIG. 9 is a flowchart 600 illustrating the association of data records with available data memory within the multi-processor architecture according to the invention. Specifically, FIG. 9 shows the control data-flow graph 602 and a partial illustration of the target architecture 604 having three memories. The control data-flow graph 602 includes the data block illustrated as DATA1 606. The data block DATA1 606 is associated with the shared memory 608. The data block DATA2 610 is also associated with the shared memory 608. The data block DATA3 612 is associated with the private memory 614.

Figure 10:
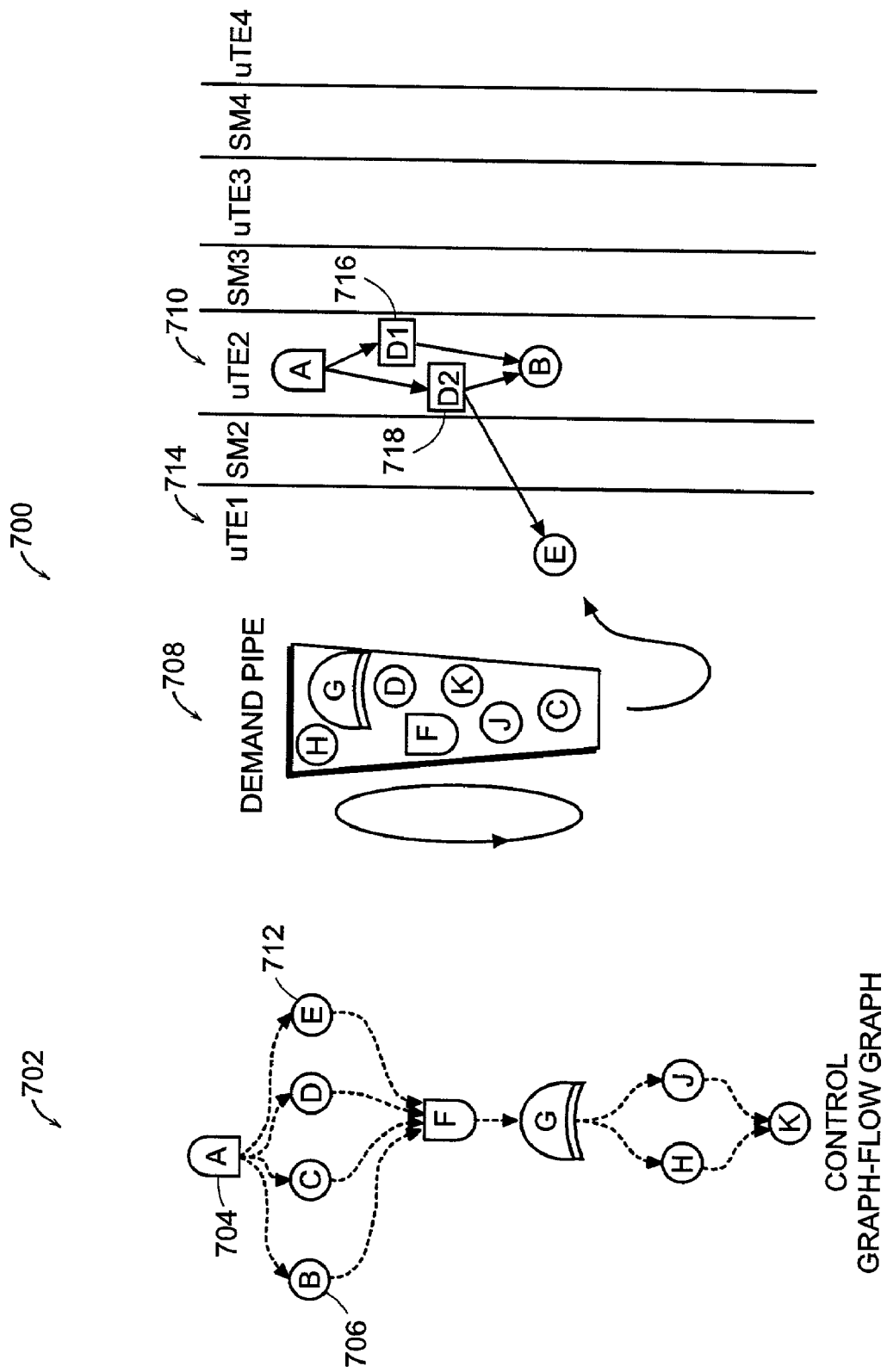
FIG. 10 is a flowchart illustrating an example of task and data prioritization and allocation in accordance with the present invention.

FIG. 10 is a flowchart 700 illustrating an example of task and data prioritization and allocation in accordance with the present invention. The control graph 702 includes task node A 704 and task node B 706. The task A 704 and the task B 706 are passed through the demand pipe 708 based on the demand function. The task A 704 and the task B 706 are then allocated to the processor uTE2 710. The task E 712 is allocated to the processor uTE1 714. The data D1 716 and the data D2 718 are allocated 'softly' to many memories and then eventually 'hard' to specific memories (e.g., SM2, SM3, private memories, etc.).

In one embodiment, the procedural-level representation of the tasks is individually analyzed after all the tasks have been assigned to processors and data has been assigned to shared and private memories. In one embodiment, known code generation and compilation techniques are used to recursively descend through the task and interval graphs to produce machine code for executing the program on the multiple processors. Furthermore, well-known techniques such as profiling the original code or instruction-level simulation can be used to measure the efficiency of the mapping with various metrics. For example, one metric for measuring the efficiency of the mapping is the utilization of the processors in the architecture.

Equivalents

While the invention has been particularly shown and described with reference to specific embodiments, it should be understood by those skilled in the art that various changes in form and detail may be made therein without departing from the spirit and scope of the invention.

What is claimed is:

1. A method of compiling a high level language to map a plurality of tasks and a plurality of data onto a very long instruction word configurable multiple processor, distributed memory hardware architecture, the method comprising:

a) describing a task-level network of behaviors that defines an embedded system in the very long instruction word configurable multiple processor, distributed memory hardware architecture, each of the task-level network of behaviors being related to each other through control and data flow;

b) predicting a schedule of tasks for the task-level network of behaviors;

c) allocating the plurality of tasks to at least two processors and allocating the plurality of data to at least two distributed memories in the very long instruction word configurable multiple processor, distributed memory hardware architecture in response to the predicted schedule of tasks; and d) generating machine executable code with the allocated plurality of tasks and allocated plurality of data for the very long instruction word configurable multiple processor, distributed memory hardware architecture that enables parallel execution of very long instruction word operations.

2. The method of claim 1 wherein the predicting the schedule of tasks comprises minimizing execution time of the plurality of tasks.

3. The method of claim 2 wherein the predicting the schedule of tasks comprises minimizing the schedule of tasks by allocating data to at least two distributed memory in the very long instruction word configurable multiple processor, distributed memory hardware architecture in order to minimize data transfers.

4. The method of claim 1 wherein the predicting the schedule of tasks comprises maximizing parallel execution of the plurality of tasks on at least two processors in the very lone instruction word configurable multiple processor, distributed memory hardware architecture.

5. The method of claim 1 wherein the allocating the plurality of tasks comprises allocating tasks to at least two processor in the very long instruction word configurable multiple processor, distributed memory hardware architecture, which has optimal processor resources for the tasks.

6. The method of claim 1 wherein the predicting the schedule of tasks comprises using a resource-based model of the very long instruction word configurable multiple processor, distributed memory hardware architecture to predict the schedule of tasks.

7. The method of claim 1 wherein the predicting the schedule of tasks comprises using an interval graph and an execution time model of the task-level network of behaviors to predict the schedule of tasks.

8. The method of claim 1 wherein the allocating the plurality of tasks and data comprises an iterative allocation process.

9. The method of claim 8 wherein the iterative allocation process comprises using a demand-driven and constraint-based objective function.

10. The method of claim 1 wherein the describing a task-level network of behaviors comprises describing a task-level network of behaviors in a high-level programming language.

11. The method of claim 10 wherein the describing the task-level network of behaviors in the high-level programming language comprises parsing the high-level programming language into an intermediate form.

12. The method of claim 1 wherein the allocating the plurality of data to the at least two distributed memories in the very long instruction word configurable multiple processor, distributed memory hardware architecture comprises allocating data to shared memories.

13. The method of claim 1 wherein the allocating the plurality of data to the at least two distributed memories in the very long instruction word configurable multiple processor, distributed memory hardware architecture comprises allocating data to private memories.

14. A method of compiling a high level language to a schedule of tasks in a very long instruction word configurable multiple processor, distributed memory architecture, the method comprising:
   a) generating the schedule of tasks based at least in part on a task-level network of behaviors that defines an embedded system;
   b) calculating a demand function based at least in part on a plurality of constraints related to at least one of a plurality of tasks in the schedule of tasks, wherein the plurality of constraints comprises an impact on the schedule of tasks, an impact on data movement, an effect of previous allocation decisions, an estimated run-time of a task, and estimated computing resources needed by a task, and wherein the demand function is a weighted sum of theses constraints;
   c) allocating a task having highest priority to a processor having least cost according to the demand function, wherein the least cost comprises a least negative impact on performance factors such as schedule of tasks and data movement;
   d) generating machine executable code with the allocated task for the very long instruction word configurable multiple processor, distributed memory hardware architecture tat enables parallel execution of very long instruction word operations.

15. The method of claim 14 further comprising allocating a data block to a memory in the distributed memory.

16. The method of claim 14 wherein the demand function is calculated based at least in part on the task-level network of behaviors.

17. The method of claim 14 wherein the performance factors comprise the schedule of tasks.

18. The method of claim 14 wherein the performance factors comprise data movement.

19. The method of claim 14 further comprising allocating a task having next highest priority to a processor having next least cost according to the demand function.

20. The method of claim 14 further comprising recalculating the demand function in response to each task in the plurality of tasks being allocated to a processor.

21. A system comprising:
   a very long instruction word configurable multiple processor, distributed memory architecture; and
   a compiler for mapping a plurality of tasks and data onto the very long instruction word configurable multiple processor, distributed memory architecture, the compiler comprising:
   a) means for describing a task-level network of behaviors that defines an embedded system, each of the task-level network of behaviors being interrelated through control and data flow dependencies;
   b) means for predicting a schedule of tasks for the task-level network;
   c) means for allocating the plurality of tasks and data to at least two processors and to at least two distributed memories in the very long instruction word configurable multiple processor, distributed memory architecture, respectively, in response to the predicted schedule of tasks to enable parallel execution of very long instruction word operations; and
   d) means for producing machine executable code for the very long instruction word configurable multiple processor, distributed memory hardware architecture based at least in part on the means for allocating the plurality of tasks and data.

22. The system of claim 21 wherein the at least two processors in the very long instruction word configurable multiple processor, distributed memory architecture communicates using at least two distributed memories in the very long instruction word configurable multiple processor, distributed memory architecture.

* * * * *

UNITED STATES PATENT AND TRADEMARK OFFICE
CERTIFICATE OF CORRECTION

PATENT NO. : 7,325,232 B2  
APPLICATION NO. : 10/057728  
DATED : January 29, 2008  
INVENTOR(S) : Clifford Liem Page 1 of 1

It is certified that error appears in the above-identified patent and that said Letters Patent is hereby corrected as shown below:

| Column, Line | Reads | Should Read |
|---|---|---|
| Column 13, Line 18 | "theses constraints" | --these constraints-- |
| Column 13, Line 27 | "tat enables" | --that enables-- |

Signed and Sealed this

Twenty-third Day of March, 2010

David J. Kappos  
*Director of the United States Patent and Trademark Office*